United States Patent
Sievers et al.

(10) Patent No.: US 9,377,497 B2
(45) Date of Patent: Jun. 28, 2016

(54) DEVICE AND METHOD FOR MONITORING A VOLTAGE SUPPLY FOR A VEHICLE SYSTEM

(71) Applicants: Falko Sievers, Reutlingen (DE); Hartmut Schumacher, Freiberg (DE); Joerg Conradt, Kornwestheim (DE); Carsten List, Walheim (DE)

(72) Inventors: Falko Sievers, Reutlingen (DE); Hartmut Schumacher, Freiberg (DE); Joerg Conradt, Kornwestheim (DE); Carsten List, Walheim (DE)

(73) Assignee: Robert Bosch GmbH, Stuttgart (DE)

( * ) Notice: Subject to any disclaimer, the term of this patent is extended or adjusted under 35 U.S.C. 154(b) by 176 days.

(21) Appl. No.: 14/367,639

(22) PCT Filed: Dec. 21, 2012

(86) PCT No.: PCT/EP2012/076548
§ 371 (c)(1),
(2) Date: Jun. 20, 2014

(87) PCT Pub. No.: WO2013/092949
PCT Pub. Date: Jun. 27, 2013

(65) Prior Publication Data
US 2014/0375327 A1    Dec. 25, 2014

(30) Foreign Application Priority Data
Dec. 22, 2011    (DE) .......................... 10 2011 089 556

(51) Int. Cl.
*G01R 31/00*    (2006.01)
*G01R 31/28*    (2006.01)
(Continued)

(52) U.S. Cl.
CPC .............. *G01R 31/005* (2013.01); *B60R 16/03* (2013.01); *B60R 21/0173* (2013.01); *G01R 19/0084* (2013.01); *G01R 31/2829* (2013.01)

(58) Field of Classification Search
CPC ......... G01R 31/00; G01R 31/28; G01R 19/00
USPC .......................................................... 324/503
See application file for complete search history.

(56) References Cited

U.S. PATENT DOCUMENTS 5,726,887 A * 3/1998 Spies ................... B60R 21/0173
280/735
2001/0009337 A1    7/2001 Ueno et al.
(Continued)

FOREIGN PATENT DOCUMENTS

CN    101959719 A    1/2011
CN    101997339 A    3/2011
(Continued)

OTHER PUBLICATIONS

International Search Report for PCT/EP2012/076548, dated Apr. 16, 2013.
(Continued)

*Primary Examiner* — Tung X Nguyen
*Assistant Examiner* — Zannatul Ferdous
(74) *Attorney, Agent, or Firm* — Norton Rose Fulbright US LLP

(57) ABSTRACT

A device for monitoring a voltage supply for a vehicle system includes a self-diagnostic function which evaluates a logic state of the comparison signal which is output by a comparison device as a function of an input signal, and checks whether a reset signal which corresponds to the output comparison signal is generatable. The self-diagnostic function recognizes a malfunction of the comparison device when the evaluated logic state of the comparison signal does not match an expected logic state. The self-diagnostic function recognizes a malfunction of the reset device when the checked logic state of the reset signal does not match an expected logic state.

10 Claims, 6 Drawing Sheets

(51) Int. Cl.
*G01R 19/00* (2006.01)
*B60R 16/03* (2006.01)
*B60R 21/017* (2006.01)

(56) References Cited

U.S. PATENT DOCUMENTS

2013/0015797 A1* 1/2013 Itou ............... H02P 29/021
 318/400.21
2014/0350791 A1* 11/2014 Matsushita ......... B62D 5/0481
 701/41

FOREIGN PATENT DOCUMENTS

| DE | 101 27 54 | 1/1957 |
|---|---|---|
| DE | 10 2008 012896 | 9/2009 |
| DE | 10 2010 028556 | 11/2011 |
| EP | 0 752 592 | 1/1997 |
| JP | H07107620 A | 4/1995 |
| JP | 2010228523 A | 10/2010 |

OTHER PUBLICATIONS

Baglia et al.: "Analysis of junction-barrier-controlled Schottky (JBS) rectifier characteristics", Solid State Electronics, Bd. 28, No. 11, Nov. 1, 1985 pp. 1089-1093.

* cited by examiner

DEVICE AND METHOD FOR MONITORING A VOLTAGE SUPPLY FOR A VEHICLE SYSTEM

BACKGROUND OF THE INVENTION

1. Field of the Invention

The present invention relates to a device and method for monitoring a voltage supply for a vehicle system.

2. Description of the Related Art

For example, a control unit and a method for controlling occupant protection means for a vehicle are described in published Unexamined German Patent Application published German patent application document DE 10 2008 012 896 A1. The described control unit includes at least two semiconductor components which control the occupant protection means. The semiconductor components provide supply voltages for the control unit, the two semiconductor components monitoring in one direction with regard to the supply voltages. The two semiconductor components carry out a joint reset operation for the control unit as a function of the monitoring of the supply voltages. When all supply voltages are within predefined value ranges, a reset input at the control unit may be enabled, and the control unit may correctly operate with the supply voltages.

German Patent DE 101 27 54 B4, for example, describes a method for monitoring a voltage supply of a control unit in a motor vehicle. In the described method, when an error is recognized for voltages present which are generated by the supply module in the control unit, a supply module interrupts the particular function of components of the control unit via a reset line. In addition, the voltages are monitored for errors via ranges and default values. Furthermore, a test of the reset line of the control unit is initiated, the supply module then interrupting the function of components with periodic pulses for a predefined period via the reset line, and a processor counting the time between the interruptions in order to monitor the functionality of the reset line.

BRIEF SUMMARY OF THE INVENTION

The device and method according to the present invention for monitoring a voltage supply for a vehicle system have the advantage over the related art that integrated voltage monitoring and a derived reset functionality may be automatically tested by the implemented self-monitoring function. The corresponding vehicle system, for example an airbag system, may thus always be placed in a secure state as soon as the functioning of the voltage monitoring is no longer ensured. It is thus advantageously possible to meet more stringent safety requirements (ASIL-D).

The core of the present invention lies in the ability to also automatically test the already integrated voltage monitoring of the internally generated supply voltages. Enabling of the system, i.e., full functionality, is thus possible only when the supply voltages themselves as well as their monitoring circuit and a reset device are error-free. Considerably greater robustness against latent errors (double errors) may thus be advantageously achieved. The result of checking the voltage monitoring may, for example, be directly measured as status information at an ASIC pin or read out according to a software instruction.

The self-diagnostic function allows initial testing of the voltage comparators used for the voltage monitoring, and thus allows the correct output of the status information and the derivation of the reset signal to be ensured. During the testing of the voltage comparators, a check may be made as to whether the output signal of the voltage comparators is able to change its logic state as a function of the input signal, and whether the status information and the reset signal may be correctly derived. In addition, it is possible to recognize static or dynamic short circuits at the status or reset lines by comparing an initially back-measured state of the corresponding line to an expected logic state. If a short circuit were recognized here, as the result of which, for example, it was not possible to trigger a reset or place the system in a secure state, it is possible to disconnect the monitored voltage supply or all voltage supplies present in the vehicle system. It may thus advantageously be ensured that either the voltage monitoring and the reset triggering function, or the vehicle system is protected from damage by disconnecting the voltage supplies. For the case that at least one error is recognized, a reset operation is reliably triggered which keeps the vehicle system in the secure state, so that no damage due to spurious triggerings and so forth may occur.

Specific embodiments of the present invention provide a device for monitoring a voltage supply for a vehicle system, which includes at least one comparison device which compares an output voltage of the voltage supply and/or a voltage derived therefrom as the first input signal to a predefined threshold voltage as the second input signal, and outputs a corresponding comparison signal, and includes a reset device which generates at least one reset signal as a function of the at least one comparison signal. According to the present invention, a self-diagnostic function is implemented which evaluates a logic state of the comparison signal, which is output by the at least one comparison device, as a function of an input signal, and checks whether a reset signal which corresponds to the output comparison signal is generatable.

The self-diagnostic function recognizes a malfunction of the comparison device when the evaluated logic state of the comparison signal does not match an expected logic state.

The self-diagnostic function recognizes a malfunction of the reset device when the checked logic state of the reset signal does not match an expected logic state.

In addition, a method for monitoring a voltage supply for a vehicle system is proposed. Via at least one comparison device, an output voltage of the voltage supply and/or a voltage derived therefrom as the first input signal is compared to a predefined threshold voltage as the second input signal, and a corresponding comparison signal is generated. Via a reset device, at least one reset signal is generated as a function of the at least one comparison signal. According to the present invention, a self-diagnostic function is implemented which evaluates a logic state of the comparison signal, which is output by the at least one comparison device, as a function of an input signal, and checks whether a reset signal which corresponds to the output comparison signal may be generated. A malfunction of the comparison device is recognized by the self-diagnostic function when the evaluated logic state of the comparison signal does not match an expected logic state. A malfunction of the reset device is recognized by the self-diagnostic function when the checked logic state of the reset signal does not match an expected logic state.

Specific embodiments of the present invention, depending on the system requirements, do not carry out the self-diagnostic function of the at least one comparison device for all output voltages or for both range limits (overvoltage and undervoltage). It is possible, for example, to also meet a portion of the safety requirements by a redundant circuit design in the form of double independent monitoring. The result of the check of the at least one comparison device and the result of the check of the reset device may be used differently. Thus, for the case that a check of the at least one comparison device fails, an active reset operation may be triggered for a corresponding airbag control unit. Thus, the airbag system is not deployable, and a secure state is achieved. For the case that a short circuit at the reset signal is recognized during the check of the reset device, the central voltage supply may be disconnected, which likewise results in a secure system state.

Furthermore, specific embodiments of the present invention may either automatically carry out the checking of the individual comparison devices, the specifying of the individual threshold voltages, and the reading back of the output signals either automatically via suitable hardware elements, or via a system software program under the control of a microcontroller. For the automatic control by hardware elements, by outputting a "non-reset signal" the vehicle system cannot become fully activated until all voltages are stable and the checks of all comparison devices have been successful. For the control by software, it is necessary to initially set the reset signal to a "non-reset state" when the various voltages are stable; only after this has occurred can the check of the at least one comparison device be started and carried out as described. When an error is recognized, the reset signal may subsequently be reset to an active "reset state."

It is particularly advantageous that the self-diagnostic function is implemented centrally in a control unit or distributed in the individual voltage supplies, for the short circuit recognition the self-diagnostic function reading back a reset signal which is output by the reset device, and comparing it to an expected logic state, the self-diagnostic function recognizing a malfunction of the reset device when the checked logic state of the read-back reset signal does not match the expected logic state.

In one advantageous embodiment of the device according to the present invention, the self-diagnostic function carries out the checking of the comparison device and/or of the reset device as a function of predefined points in time and/or system states. The self-diagnostic function may thus be optimally adapted to various specific embodiments of the vehicle systems to be checked.

In another advantageous embodiment of the device according to the present invention, a first comparison device of an undervoltage monitoring system may compare a first input signal to a predefined first threshold voltage as the second input signal, and may output a corresponding first comparison signal. The self-diagnostic function may detect the logic state of the first comparison signal during a run-up phase of the voltage supply in which the first input signal is lower than the second input signal based on the state, and may compare the detected logic state to a logic state of the first comparison signal which the self-diagnostic function detects at a subsequent point in time at which the voltage supply is in the operating state, and the first input signal is higher than the second input signal based on the state. The self-diagnostic function may recognize a malfunction of the undervoltage monitoring system when the two detected logic states of the first comparison signal are the same or do not match expected logic states. Additionally or alternatively, a second comparison device of an overvoltage monitoring system may compare a first voltage, derived from the output voltage of the voltage supply, as a first input signal to a predefined second threshold voltage as a second input signal, and may output a corresponding second comparison signal. The self-diagnostic function may detect the logic state of the second comparison signal during an operating phase of the voltage supply in which the first input signal is higher than the second input signal based on the state. In addition, at a subsequent point in time the self-diagnostic function may apply, via a switchover unit, a second voltage being derived from the output voltage of the voltage supply as the first input signal to the second comparator which is lower than the second input voltage based on the state, and may compare the corresponding logic state of the second comparison signal to the previous logic state of the second comparison signal. The self-diagnostic function may recognize a malfunction of the overvoltage monitoring system when the two detected logic states of the second comparison signal are the same or do not match expected logic states.

In one advantageous embodiment of the method according to the present invention, for short circuit recognition an output reset signal is read back by the self-diagnostic function and compared to an expected logic state, a malfunction of the reset device being recognized by the self-diagnostic function when the checked logic state of the reset signal does not match the expected logic state.

In another advantageous embodiment of the method according to the present invention, the self-diagnostic function may be carried out as a function of predefined points in time and/or system states.

In another advantageous embodiment of the method according to the present invention, a first input signal from a first comparison device of an undervoltage monitoring system may be compared to a predefined first threshold voltage as the second input signal, and a corresponding first comparison signal may be output. The logic state of the first comparison signal may be detected by the self-diagnostic function during a run-up phase of the voltage supply in which the first input signal is lower than the second input signal based on the state, and may be compared to a logic state of the first comparison signal which is detected by the self-diagnostic function at a subsequent point in time at which the voltage supply is in the operating state, and the first input signal is higher than the second input signal based on the state. A malfunction of the undervoltage monitoring may be recognized by the self-diagnostic function when the two detected logic states of the first comparison signal are the same or do not match expected logic states. Additionally or alternatively, a second comparison device of an overvoltage monitoring system may compare a first voltage, derived from the output voltage of the voltage supply, as a first input signal to a predefined second threshold voltage as a second input signal, and may output a corresponding second comparison signal. The logic state of the second comparison signal may be detected by the self-diagnostic function during an operating phase of the voltage supply in which the first input signal is higher than the second input signal based on the state, and at a subsequent point in time the self-diagnostic function may apply a second voltage, derived from the output voltage of the voltage supply as the first input signal to the second comparator which is lower than the second input voltage based on the state. The corresponding logic state of the second comparison signal may be compared to the previous logic state of the second comparison signal, whereby a malfunction of the overvoltage monitoring may be recognized by the self-diagnostic function when the two detected logic states of the second comparison signal are the same or do not match expected logic states.

Exemplary embodiments of the present invention are illustrated in the drawings and explained in greater detail in the following description. Components or elements which carry out identical or similar functions are denoted by the same reference numerals in the drawings.

DETAILED DESCRIPTION OF THE INVENTION

Present airbag control units are characterized, among other things, in that all supply voltages that are necessary for operation of the airbag system are generated within the airbag system itself. It is thus ensured that correct functionality is provided, regardless of fluctuations of the battery voltage in the vehicle. In addition, monitoring of the system-relevant supply voltages for supplying analog and digital functions is integrated. The monitoring guarantees that the airbag system is placed in a secure state as soon as one of the supply voltages deviates from the specified voltage range, for example due to internal or external errors, or due to discontinuance/disconnection of the voltage of the vehicle battery. This function may be implemented by a system-internal reset signal which places all supplied active system components in a secure "off" state. Malfunctions due to unreliable supply voltages may thus be essentially ruled out.

The voltage monitoring implemented thus far for voltage supplies, which is designed as a linear controller, DC/DC switching converter, or voltage source, is for the most part designed in such a way that the controlled output voltage at an undervoltage threshold and/or an overvoltage threshold is monitored with the aid of at least one voltage comparator. If the output voltage is outside the permissible range, this state is recognized via the at least one voltage comparator, so that appropriate analog and/or logic states or responses may be derived. The comparison signal of the at least one voltage comparator which is based on the comparison result may be output in the form of status information, for example, and/or used for triggering a reset signal.

Figure 1:
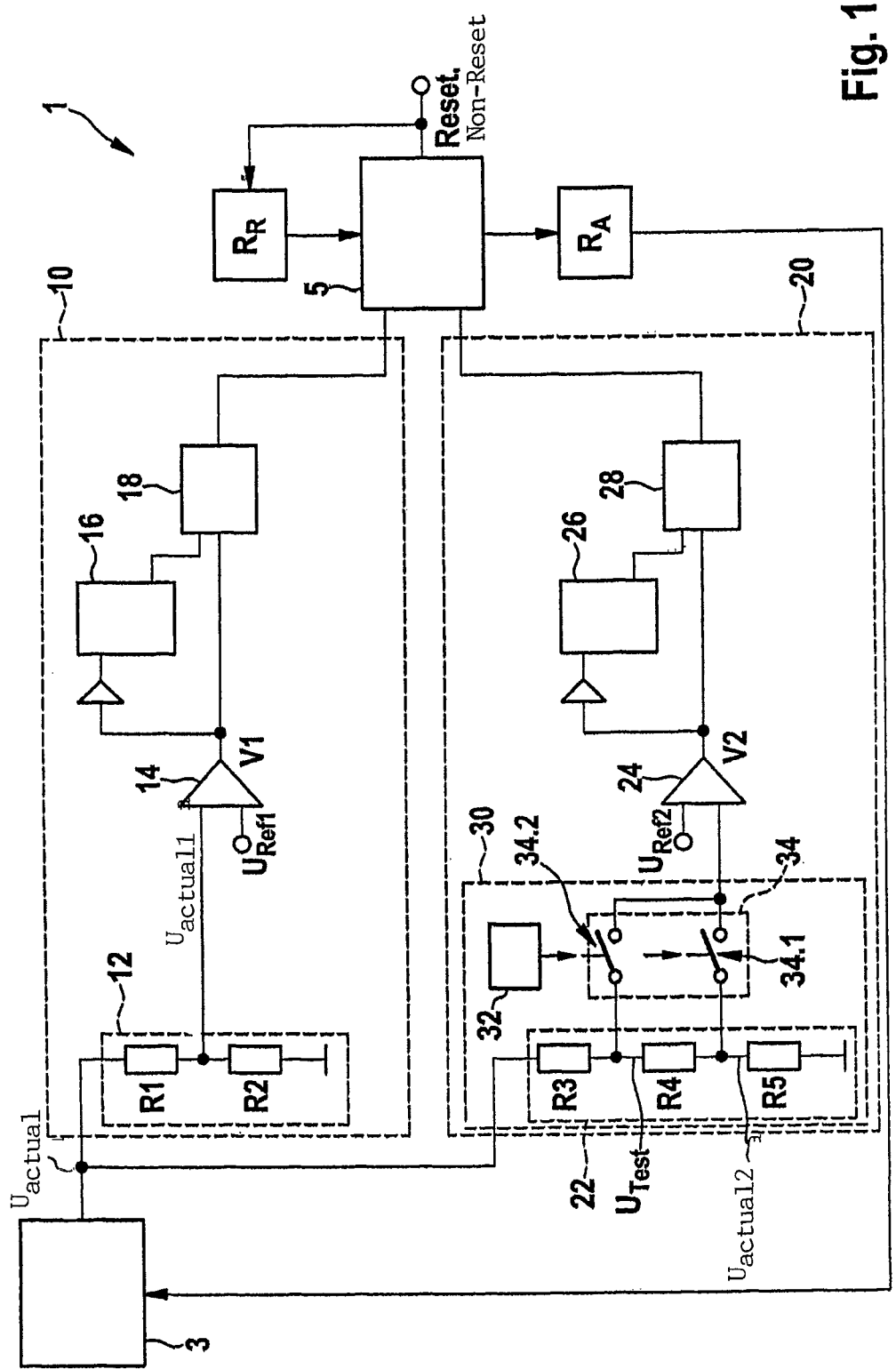
FIG. 1 shows a schematic block diagram of one exemplary embodiment of a device according to the present invention for monitoring a voltage supply for a vehicle system.

As is apparent from FIG. 1, the illustrated exemplary embodiment of a device 1 according to the present invention for monitoring a voltage supply 3 for a vehicle system includes at least one comparison device 14, 24 which compares an output voltage $U_{actual}$ of voltage supply 3 and/or a voltage $U_{actual1}$, $U_{actual2}$, $U_{test}$ derived therefrom as the first input signal to a predefined threshold voltage $U_{Ref1}$, $U_{Ref2}$ as the second input signal, and outputs a corresponding comparison signal V1, V2, and includes a reset device 5 which generates at least one reset signal reset, non-reset as a function of the at least one comparison signal V1, V2.

According to the present invention, a self-diagnostic function is implemented which evaluates a logic state of comparison signal V1, V2 which is output by the at least one comparison device 14, 24 as a function of an input signal $U_{actual1}$, $U_{actual2}$, $U_{test}$, and checks whether a reset signal reset, non-reset which corresponds to output comparison signal V1, V2 is generatable. The self-diagnostic function recognizes a malfunction of comparison device 14, 24 when the evaluated logic state of comparison signal V1, V2 does not match an expected logic state. The self-diagnostic function recognizes a malfunction of reset device 5 when the checked logic state of reset signal reset, non-reset does not match an expected logic state.

As is further apparent from FIG. 1, in the illustrated exemplary embodiment, voltage monitoring device 1 for voltage supply 3 includes an undervoltage monitoring system 10 and an overvoltage monitoring system 20.

A first comparison device 14 of undervoltage monitoring system 10 is designed as a voltage comparator which compares a first input signal, which as voltage $U_{actual1}$ is derived from output voltage $U_{actual}$ of voltage supply 3 via a first voltage divider 12 composed of two resistors R1, R2, to a predefined first threshold voltage $U_{Ref1}$ as the second input signal. First comparison device 14 outputs a corresponding first comparison signal V1. First comparison signal V1 is monitored via a first error flip-flop 16, preferably a D flip-flop, and an associated first evaluation logic system 18 in order to check whether first comparison signal V1 of first comparison device 14 ever changes from a first state "poor" to a second state "good" during the self-diagnostic function. The self-diagnostic function thus detects the logic state of first comparison signal V1 during a run-up phase of voltage supply 3 in which first input signal $U_{actual1}$ is lower than second input signal $U_{Ref1}$ based on the state. The self-diagnostic function compares the logic state of first comparison signal V1, which is detected during the run-up phase and which represents the expected first state "poor," to a logic state of first comparison signal V1 which the self-diagnostic function detects at a subsequent point in time. At this subsequent point in time, voltage supply 3 is in the operating state, and first input signal $U_{actual1}$ is higher than second input signal $U_{Ref1}$ based on the state, so that the expected state of the subsequently detected logic state corresponds to the second state "good." The self-diagnostic function recognizes a malfunction of undervoltage monitoring system 10 when the two detected logic states of first comparison signal V1 are the same, or the expected logic state of the comparison signal does not match the detected logic state of the comparison signal.

Similarly as for first comparison device 14 of undervoltage monitoring system 10, a second comparison device 24 of overvoltage monitoring system 20 is designed as a voltage comparator which via a switchover unit 30 receives a voltage $U_{actual2}$, $U_{test}$ derived from output voltage $U_{actual}$ of voltage supply 3, as a first input signal. Switchover unit 30 includes a second voltage divider 22 which is composed of three resistors R3, R4, R5 and which provides two voltages $U_{actual2}$, $U_{test}$ derived from output voltage $U_{actual}$ of voltage supply 3, as the first input signal, and a switching unit 34 which is controlled by a control logic system 32 and which has two switching elements 34.1, 34.2 for selecting one of the two derived voltages $U_{actual2}$, $U_{test}$ as the first input signal. The divider ratio of second voltage divider 22 is selected in such a way that a first voltage $U_{test}$, derived from output voltage $U_{actual}$ of voltage supply 3 which operates during normal operation, is higher, and a second voltage $U_{actual2}$, derived from output voltage $U_{actual}$ of voltage supply 3 which operates during normal operation, is lower, than a predefined threshold voltage $U_{Ref2}$ as the second input signal.

For checking overvoltage monitoring system 20, during an operating phase at a first point in time, the self-diagnostic function applies derived first voltage $U_{test}$ as first input signal $U_{actual2}$ to second comparison device 24 via a first switching element 34.2, a second switching element 34.1 being open at the first point in time. Second comparison device 24 compares first input signal $U_{test}$ to predefined second threshold voltage $U_{Ref2}$ as the second input signal, and outputs a corresponding second comparison signal V2. Second comparison signal V2, similarly as for first comparison signal V1, is monitored via a second error flip-flop 26, preferably a D flip-flop, and an associated second evaluation logic system 28 in order to check whether second comparison signal V2 of second comparison device 24 ever changes from the first state "poor" to the second state "good" during the self-diagnostic function. Since the self-diagnostic function detects the logic state of second comparison signal V2 while first derived voltage $U_{test}$ as the first input signal is applied to second comparison device 24, which is higher than second input signal $U_{Ref1}$ based on the state, the expected logic state of second comparison signal V2 corresponds to the first state "poor." For further checking of overvoltage monitoring system 20, during the operating phase at a subsequent second point in time, the self-diagnostic function applies derived second voltage $U_{actual2}$ as the first input signal to second comparison device 24 via a second switching element 34.1, first switching element 34.2 being open at the second point in time. Second comparison device 24 compares first input signal $U_{actual2}$ to predefined second threshold voltage $U_{Ref2}$ as the second input signal, and outputs a corresponding second comparison signal V2. Since the self-diagnostic function detects the logic state of second comparison signal V2 while second derived voltage $U_{actual2}$, which is lower than second input signal $U_{Ref1}$ based on the state, is applied as the first input signal to second comparison device 24, the expected logic state of second comparison signal V2 corresponds to the second state "good." The self-diagnostic function recognizes a malfunction of overvoltage monitoring system 20 when the two detected logic states of second comparison signal V2 are the same, or the expected logic state of the comparison signal does not match the detected logic state of the comparison signal.

As an alternative to first or second error flip-flop 16, 26, respectively, and first or second evaluation logic system 18, 28, respectively, the monitoring of first or second comparison signal V1, V2, respectively, may be implemented via appropriate software instructions which read out the logic states, and via a software program which runs on a processor and checks the read-out logic states of first or second comparison signal V1, V2, respectively.

In addition, switchover unit 30 described in conjunction with overvoltage monitoring system 20 may also be used for undervoltage monitoring system 10, in which case the divider ratio of second voltage divider 22 is selected in such a way that that a first voltage $U_{test}$, derived from output voltage $U_{actual}$ of voltage supply 3 which operates during normal operation, is lower, and a second voltage $U_{actual2}$, derived from output voltage $U_{actual}$ of voltage supply 3 which operates during normal operation, is higher, than a threshold voltage $U_{Ref1}$ which is predefined as the second input signal. As a result, initially the first state "poor," and then the second state "good," is recognized during the check of undervoltage monitoring system 10. It is thus possible to carry out the self-diagnosis of the voltage monitoring not only during the run-up of voltage supply 3, but also at any arbitrary points in time.

The self-diagnostic function may, for example, be implemented centrally in a control unit of the corresponding vehicle system, for example in an airbag control unit, or distributed in individual voltage supplies 3. For short circuit recognition, the self-diagnostic function reads back a reset signal reset, non-reset which is output by reset device 5, and compares the reset signal to a logic state to be expected. The self-diagnostic function recognizes a malfunction of reset device 5 when the checked logic state of read-back reset signal $R_R$ does not match the expected logic state. Thus, when there is a recognized short circuit at the output of reset device 5, a safety disconnect of voltage supply 3 may take place via a disconnect signal $R_A$.

It is thus ensured that either the voltage monitoring, in the form of undervoltage monitoring system 10 and overvoltage monitoring system 20, and the triggering of reset signal "reset," "non-reset" is functioning, or that the vehicle system is protected from damage by disconnecting voltage supply 3. For the case that at least one error is recognized, the active "reset signal" is reliably triggered, which keeps the system in the secure state.

One exemplary embodiment of the method according to the present invention for monitoring a voltage supply 3 for a vehicle system is described below with reference to FIGS. 2 through 8.

Figure 2:
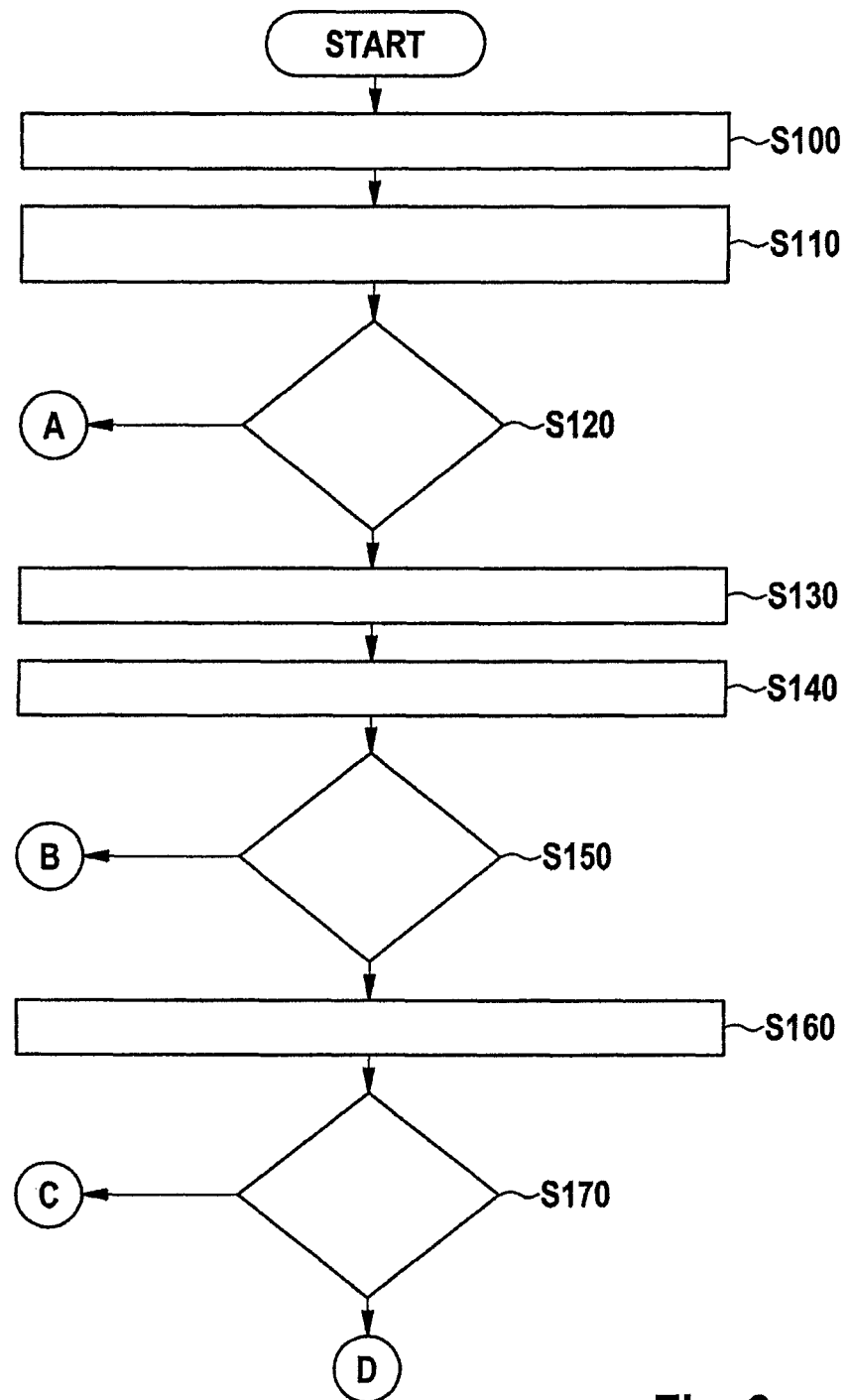
FIGS. 2 through 8 show a schematic flow chart of one exemplary embodiment of a method according to the present invention for monitoring a voltage supply for a vehicle system.

As is further apparent from FIG. 2, voltage supply 3 to be monitored is activated in step S100. During the run-up phase of voltage supply 3 to be monitored, an output signal of undervoltage monitoring system 10 is read out in step S110. First comparison device 12 of undervoltage monitoring system 10 must recognize a state "undervoltage," i.e., the first state "poor," since at this point in time, voltage $U_{actual1}$ which is derived from output voltage $U_{actual}$ of voltage supply 3 has not yet reached predefined threshold voltage $U_{Ref1}$ at this point in time. Alternatively, via switchover unit 30, based on output voltage $U_{actual}$ of voltage supply 3, an excessively low voltage which is lower than predefined threshold voltage $U_{Ref1}$ may be intentionally generated as the first input signal for first comparison device 12 in order to generate the undervoltage state, i.e., the first state "poor." A check is made in step S120 as to whether the undervoltage state has been recognized. If the undervoltage state has been recognized, the method is continued with step S130. If the undervoltage state has not been recognized, the method is continued with an error correction, described below, according to step S400 illustrated in FIG. 5.

Due to the recognized undervoltage state, reset signal "reset" is set and output in step S130. Output reset signal "reset" is read back in step S140. Read-back reset signal $R_R$ is checked in step S150 as to whether reset signal "reset" is set, i.e., active. If reset signal "reset" is active, the method is continued with step S160. If reset signal "reset" is not active, the method is continued with an error correction, described below, according to step S500 illustrated in FIG. 8.

In step S160 the overvoltage test threshold is set, and first voltage $U_{test}$, derived from output voltage $U_{actual}$ of voltage supply 3, as the first input signal is applied to second comparison device 24. An overvoltage may be achieved only in the event of an error, for example, if the voltage regulator that is used is faulty or the output voltage of the voltage regulator or of the voltage source has a short circuit at a higher voltage. To nevertheless be able to carry out the checking at each system start, for the overvoltage monitoring an excessively high voltage level $U_{test}$ is intentionally selected for the comparison to predefined threshold voltage $U_{Ref2}$. After excessively high voltage level $U_{test}$ has been set via switchover unit 30, second comparison device 24 must indicate and output the state "overvoltage," i.e., the first state "poor." A check is made in step S170 as to whether the overvoltage state has been recognized. If the overvoltage state has been recognized, the method is continued with step S180 illustrated in FIG. 3. If the overvoltage state has not been recognized, the method is continued with an error correction, described below, according to step S420 illustrated in FIG. 6.

Figure 3:
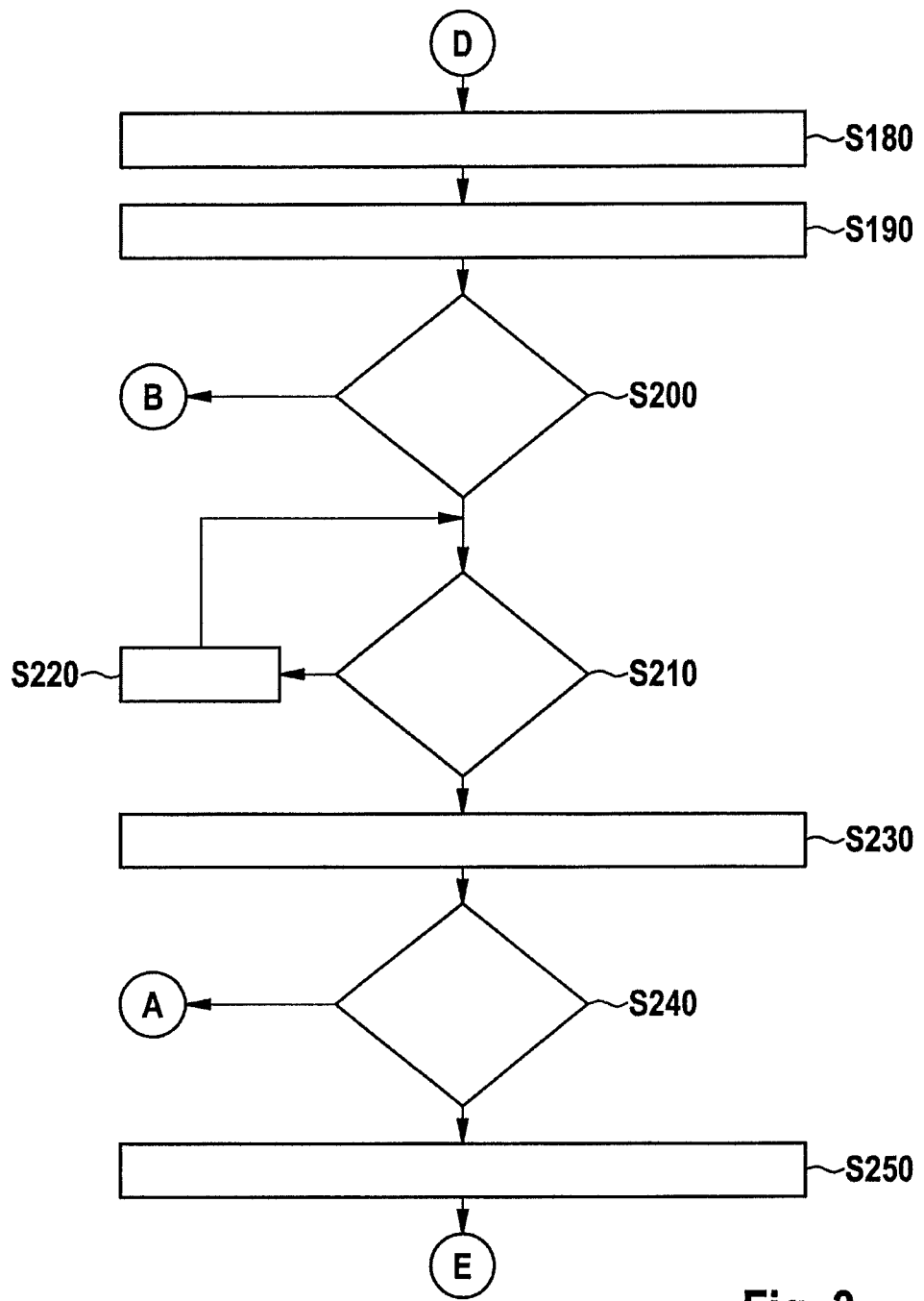

As is further apparent from FIG. 3, due to the recognized overvoltage state, reset signal "reset" is set and output in step S180. Output reset signal "reset" is read back in step S190. Read-back reset signal $R_R$ is checked in step S200 as to whether reset signal "reset" is set, i.e., active. If reset signal "reset" is active, the method is continued with step S210. If reset signal "reset" is not active, the method is continued with the error correction, described below, according to step S500 illustrated in FIG. 8. Reset signal "reset" which is generated based on the comparison voltages of first and second comparators 14, 24 represents cumulative information for all voltage monitoring in the system. Therefore, during the checking of the undervoltage monitoring and the overvoltage monitoring, reset signal "reset" must stay at an active "reset state";

i.e., the system is held in the reset state, i.e., in a secure "off" state. This expected state "reset" of the reset signal is checked by reading back output reset signal "reset."

As is further apparent from FIG. 3, a check is made in step S210 as to whether the run-up phase of voltage supply 3 has concluded. If the run-up phase has not yet concluded, a predefined pause time is waited for in step S220, and the check is then carried out anew in step S210. Steps S210 and S220 are repeated until the run-up phase has been recognized as concluded. The output signal of undervoltage monitoring system 10 is then read out anew in step S230. First comparison device 12 of undervoltage monitoring system 10 must recognize a state "non-undervoltage," i.e., the second state "good," since at this point in time, voltage $U_{actual1}$ which is derived from output voltage $U_{actual}$ of voltage supply 3 must be above predefined threshold voltage $U_{Ref1}$. In the alternative embodiment, via switchover unit 30, based on output voltage $U_{actual}$ of voltage supply 3 a voltage is intentionally generated as the first input signal for first comparison device 12 which represents output voltage $U_{actual}$ of voltage supply 3 and which is higher than predefined threshold voltage $U_{Ref1}$ in order to generate the non-undervoltage state, i.e., the second state "good." A check is made in step S240 as to whether the non-undervoltage state has been recognized. If the non-undervoltage state has been recognized, the method is continued with step S250. If the non-undervoltage state has not been recognized, the method is continued with an error correction, described below, according to step S400 illustrated in FIG. 5.

Figure 4:
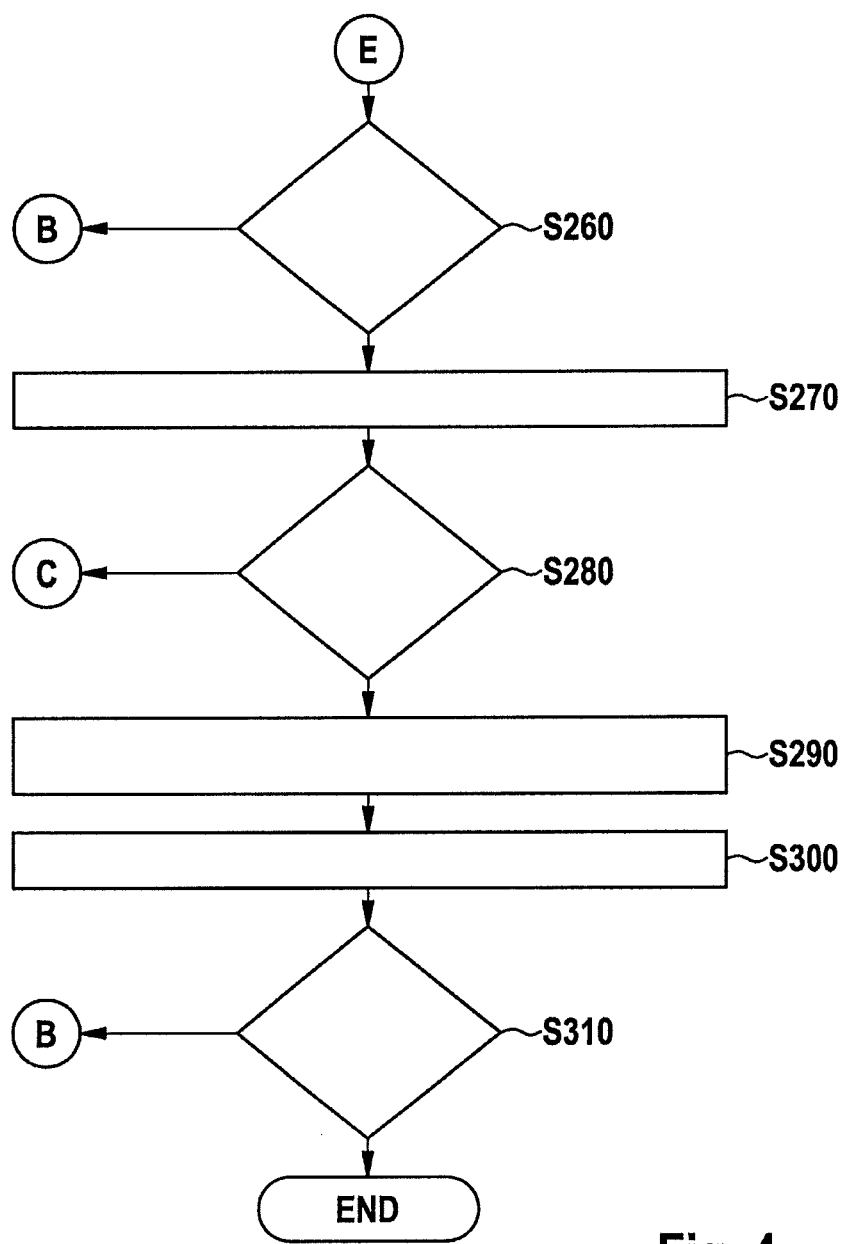

The reset signal is read back anew in step S250, and the method is continued with step S260 illustrated in FIG. 4. Read-back reset signal $R_R$ is checked in step S260 as to whether reset signal "reset" is still set, i.e., active. If reset signal "reset" is still active, the method is continued with step S270. If reset signal "reset" is no longer active, the method is continued with the error correction, described below, according to step S500 illustrated in FIG. 8.

The overvoltage threshold is set in step S270. This means that second voltage $U_{actual2}$, derived from output voltage $U_{actual}$ of voltage supply 3, as the first input signal is applied to second comparison device 24. Derived second voltage $U_{actual2}$ represents output voltage $U_{actual}$ of voltage supply 3, and during normal operation is lower than predefined threshold voltage $U_{Ref2}$. After normal voltage level $U_{actual2}$ is set via switchover unit 30, second comparison device 24 must indicate and output the state "non-overvoltage," i.e., the second state "good." A check is made in step S280 as to whether the non-overvoltage state has been recognized. If the non-overvoltage state has been recognized, the method is continued with step S290. If the non-overvoltage state has not been recognized, the method is continued with the error correction, described below, according to step S420 illustrated in FIG. 6.

Due to the recognized non-undervoltage state and the recognized non-overvoltage state, reset signal "non-reset" is set and output in step S290. Output reset signal "non-reset" is read back in step S300. Read-back reset signal $R_R$ is checked in step S310 as to whether reset signal "non-reset" is set, i.e., active. If reset signal "non-reset" is active, the corresponding vehicle system is placed in an "on" state. If reset signal "non-reset" is not active, the method is continued with the error correction, described below, according to step S500 illustrated in FIG. 8. As soon as voltage $U_{actual1}$, derived from output voltage $U_{actual}$, arrives at the allowed (controlled) voltage range, first comparison device 14 of undervoltage monitoring system 10 must change to the state "non-undervoltage." In addition, for second comparison device 24 of overvoltage monitoring system 20, correct voltage level $U_{actual2}$ is selected for the comparison with predefined threshold voltage $U_{Ref2}$. If second voltage level $U_{actual2}$, derived from output voltage $U_{actual}$, is in the valid range, i.e., below overvoltage threshold $U_{Ref2}$, second comparison device 24 must now likewise change to the state "non-overvoltage." Only when each comparison device 14, 24 indicates the "good" state, i.e., "non-undervoltage" and "non-overvoltage," may the reset signal change to the active "non-reset" state, and the vehicle system is activated. Here as well, the expected state of the reset signal is checked by reading back the output reset signal.

As soon as an error is recognized in one of the checking steps carried out, a corresponding error state is output or indicated. This may take place either by triggering an active reset signal or by outputting status information which is readable, for example, via an output signal or a software instruction. It is also possible to actively disconnect the voltage supply in question, or other voltage supplies or all voltage supplies of the vehicle system until a system restart takes place.

Figure 5:
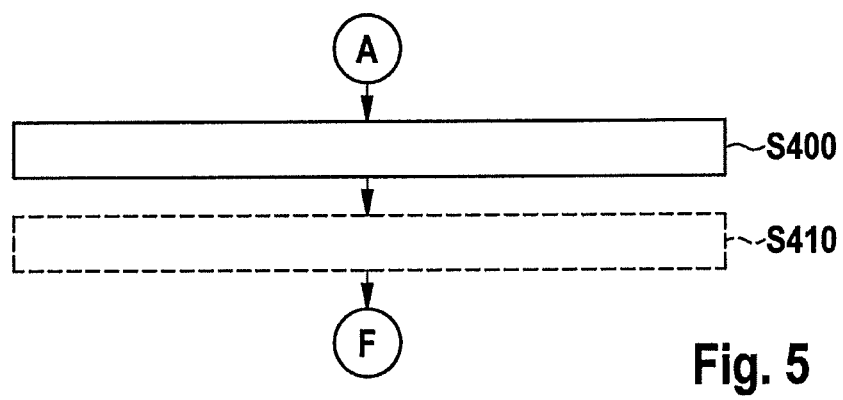

As is apparent from FIG. 5, for the case that the state "undervoltage" has not been recognized in step S120, or for the case that the state "non-undervoltage" has not been recognized in step S240, a corresponding error is output in step S400 to the effect that undervoltage monitoring system 10 is malfunctioning. In addition, corresponding voltage supply 3 may be disconnected via an appropriate disconnect signal $R_A$ in step S410 before the method is continued with step S440, described below and illustrated in FIG. 7.

Figure 6:
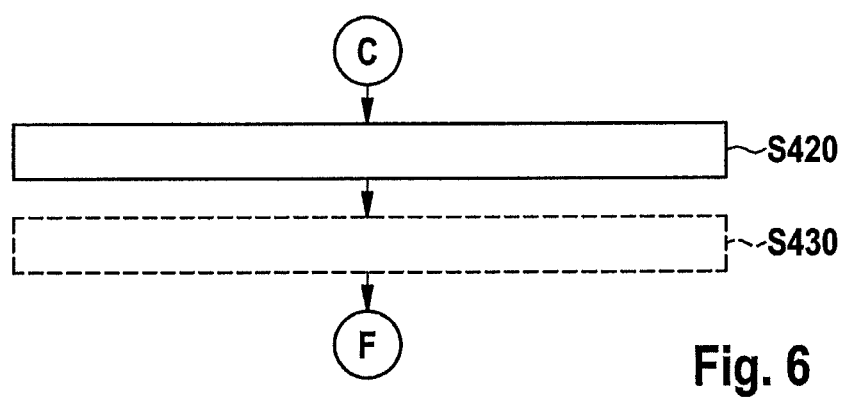

As is apparent from FIG. 6, for the case that the state "overvoltage" has not been recognized in step S170, or for the case that the state "non-overvoltage" has not been recognized in step S280, a corresponding error is output in step S420 to the effect that overvoltage monitoring system 20 is malfunctioning. In addition, corresponding voltage supply 3 may be disconnected via disconnect signal $R_A$ in step S430 before the method is continued with step S440, described below and illustrated in FIG. 7.

Figure 7:
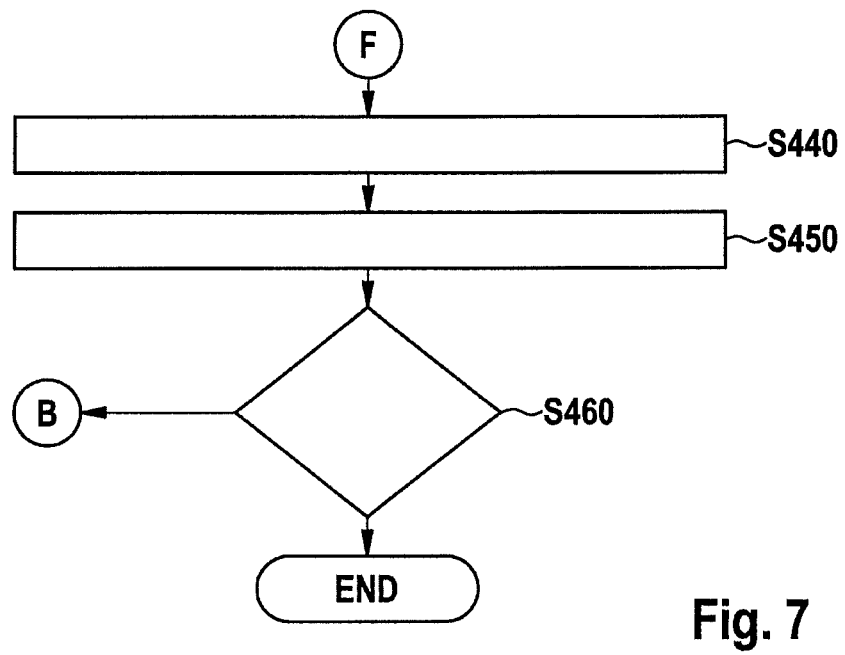

As is apparent from FIG. 7, due to faulty undervoltage monitoring system 10 or overvoltage monitoring system 20, reset signal "reset" is set and output in step S440. Output reset signal "reset" is read back in step S450. Read-back reset signal $R_R$ is checked in step S460 as to whether reset signal "reset" is set, i.e., active. If reset signal "reset" is active, the method is terminated and the system is kept in the reset state, i.e., in the secure "off" state. If reset signal "reset" is not active, the method is continued with an error correction, described below, according to step S500 illustrated in FIG. 8.

Figure 8:
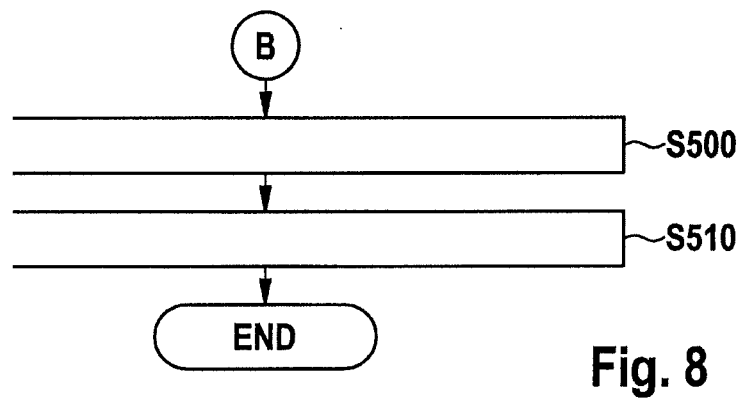

As is apparent from FIG. 8, for the case that the state of reset signal "reset" was not active in step S150, in step S200, in step S260, or in step S460, or for the case that the state of reset signal "non-reset" was not active in step S310, a corresponding error is output in step S500 to the effect that reset device 5 is malfunctioning. In the illustrated exemplary embodiment, all voltage supplies of the vehicle system are disconnected and the method is terminated in step S510. Alternatively, only corresponding voltage supply 3 may be disconnected via disconnect signal $R_A$ in step S510.

Specific embodiments of the present invention may also automatically test already integrated voltage monitoring of the internally generated supply voltages. Enabling of the system (full functionality) is thus possible only when the supply voltages themselves as well as their monitoring circuits and reset devices are error-free. Thus, considerably higher robustness against latent errors is provided. The vehicle system, preferably an airbag system, is thus always placed in a secure state as soon as the functioning of the voltage monitoring is no longer ensured. It is thus possible to meet more stringent safety requirements (ASIL-D).

What is claimed is:

1. A device for monitoring a voltage supply for a vehicle system, comprising:
at least one comparison device which compares at least one of an output voltage of the voltage supply and a voltage derived from the output voltage as a first input signal to a predefined threshold voltage as a second input signal, and outputs a resulting comparison signal to a reset device which generates at least one reset signal as a function of the comparison signal; and
means for performing a self-diagnostic function which (i) evaluates a logic state of the comparison signal which is output by the comparison device and (ii) evaluates a logic state of the reset signal, wherein the self-diagnostic function recognizes a malfunction of the comparison device when the evaluated logic state of the comparison signal does not match an expected logic state, and wherein the self-diagnostic function recognizes a malfunction of the reset device when the evaluated logic state of the reset signal does not match an expected logic state.

2. The device as recited in claim 1, wherein:
the self-diagnostic function is implemented one of (i) centrally in a control unit or (ii) in the individual voltage supply; and
for short circuit recognition, the self-diagnostic function compares the logic state of the reset signal to an expected logic state, the self-diagnostic function recognizing a malfunction of the reset device when the evaluated logic state of the reset signal does not match the expected logic state.

3. The device as recited in claim 1, wherein the self-diagnostic function carries out at least one of the evaluation of the comparison device and the evaluation of the reset device as a function of at least one of predefined points in time and predefined system states.

4. The device as recited in claim 1, wherein a comparison device of an undervoltage monitoring system compares the first input signal to a predefined first threshold voltage as the second input signal, and outputs a resulting first comparison signal, the self-diagnostic function detecting the logic state of the first comparison signal during a run-up phase of the voltage supply in which the first input signal is lower than the second input signal, and compares the detected logic state to a logic state of the first comparison signal which the self-diagnostic function detects at a subsequent point in time at which the voltage supply is in the operating state and the first input signal is higher than the second input signal, and the self-diagnostic function recognizing a malfunction of the undervoltage monitoring system when the detected logic state of the first comparison signal and the logic state of the first comparison signal at the subsequent point in time are one of (i) the same or (ii) do not match expected logic states.

5. The device as recited in claim 1, wherein a comparison device of an overvoltage monitoring system compares a first voltage, derived from the output voltage of the voltage supply, as the first input signal to a predefined second threshold voltage as the second input signal, and outputs a resulting second comparison signal, the self-diagnostic function detecting the logic state of the second comparison signal during an operating phase of the voltage supply in which the first input signal is higher than the second input signal, and at a subsequent point in time the self-diagnostic function applying via a switchover unit a second voltage, derived from the output voltage of the voltage supply, as the first input signal which is lower than the second input voltage, to the comparison device, and comparing the detected logic state of the second comparison signal to the previous logic state of the second comparison signal, and the self-diagnostic function recognizing a malfunction of the overvoltage monitoring system when the detected logic state and the previous logic state of the second comparison signal are one of (i) the same or (ii) do not match expected logic states.

6. A method for monitoring a voltage supply for a vehicle system, comprising:
comparing, by a comparison device, at least one of an output voltage of the voltage supply and a voltage derived from the output voltage as a first input signal to a predefined threshold voltage as a second input signal to generate a resulting comparison signal;
generating, by a reset device, at least one reset signal as a function of the comparison signal; and
performing a self-diagnostic function which (i) evaluates a logic state of the comparison signal which is output by the comparison device and (ii) evaluates a logic state of the reset signal, wherein the self-diagnostic function recognizes a malfunction of the comparison device when the evaluated logic state of the comparison signal does not match an expected logic state, and wherein the self-diagnostic function recognizes a malfunction of the reset device when the evaluated logic state of the reset signal does not match an expected logic state.

7. The method as recited in claim 6, wherein for short circuit recognition, the self-diagnostic function compares the logic state of the reset signal to an expected logic state, the self-diagnostic function recognizing a malfunction of the reset device when the evaluated logic state of the reset signal does not match the expected logic state.

8. The method as recited in claim 6, wherein the self-diagnostic function carries out at least one of the evaluation of the comparison device and the evaluation of the reset device as a function of at least one of predefined points in time and predefined system states.

9. The method as recited in claim 6, wherein a comparison device of an undervoltage monitoring system compares the first input signal to a predefined first threshold voltage as the second input signal, and outputs a resulting first comparison signal, the self-diagnostic function detecting the logic state of the first comparison signal during a run-up phase of the voltage supply in which the first input signal is lower than the second input signal, and compares the detected logic state to a logic state of the first comparison signal which the self-diagnostic function detects at a subsequent point in time at which the voltage supply is in the operating state and the first input signal is higher than the second input signal, and the self-diagnostic function recognizing a malfunction of the undervoltage monitoring system when the detected logic state of the first comparison signal and the logic state of the first comparison signal at the subsequent point in time are one of (i) the same or (ii) do not match expected logic states.

10. The method as recited in claim 6, wherein a comparison device of an overvoltage monitoring system compares a first voltage, derived from the output voltage of the voltage supply, as the first input signal to a predefined second threshold voltage as the second input signal, and outputs a resulting second comparison signal, the self-diagnostic function detecting the logic state of the second comparison signal during an operating phase of the voltage supply in which the first input signal is higher than the second input signal, and at a subsequent point in time the self-diagnostic function applying via a switchover unit a second voltage, derived from the output voltage of the voltage supply, as the first input signal which is lower than the second input voltage, to the comparison device, and comparing the detected logic state of the second comparison signal to the previous logic state of the second comparison signal, and the self-diagnostic function recognizing a malfunction of the overvoltage monitoring system when the detected logic state and the previous logic state of the second comparison signal are one of (i) the same or (ii) do not match expected logic states.

* * * * *